United States Patent
Na et al.

(10) Patent No.: US 7,737,687 B2
(45) Date of Patent: Jun. 15, 2010

(54) FLUXGATE SENSOR HAVING CONBZR MAGNETIC CORE AND FABRICATION METHOD THEREOF

(75) Inventors: Kyung-won Na, Seoul (KR); Jingli Yuan, Yongin-si (KR); Sang-on Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 593 days.

(21) Appl. No.: 11/582,357

(22) Filed: Oct. 18, 2006

(65) Prior Publication Data

US 2007/0085535 A1    Apr. 19, 2007

(30) Foreign Application Priority Data

Oct. 19, 2005 (KR) .................. 10-2005-0098597

(51) Int. Cl.
*G01R 33/04* (2006.01)
*G01R 33/02* (2006.01)

(52) U.S. Cl. ...................... 324/253; 324/249

(58) Field of Classification Search ............ 324/207.21, 324/249, 252, 253; 257/421–427; 438/3, 438/14; 29/607, 609
See application file for complete search history.

(56) References Cited

U.S. PATENT DOCUMENTS

| 6,698,840 | B1 * | 3/2004 | Tseng ................. 297/440.15 |
|---|---|---|---|
| RE38,594 | E * | 9/2004 | Murata et al. .......... 360/123.05 |
| 7,015,691 | B2 * | 3/2006 | Kang et al. ................. 324/253 |
| 7,087,450 | B2 * | 8/2006 | Choi et al. ..................... 438/48 |
| 7,208,947 | B2 * | 4/2007 | Park et al. ................... 324/253 |
| 7,212,001 | B2 * | 5/2007 | Choi et al ................... 324/253 |
| 7,372,261 | B2 * | 5/2008 | Choi et al. .................. 324/253 |
| 7,382,123 | B2 * | 6/2008 | Na et al. ..................... 324/253 |
| 7,389,576 | B2 * | 6/2008 | Na et al. ........................ 29/595 |
| 7,407,596 | B2 * | 8/2008 | Choi et al. ..................... 216/35 |
| 2003/0006763 | A1 * | 1/2003 | Takayama et al. ........... 324/249 |
| 2004/0027121 | A1 * | 2/2004 | Choi et al. .................. 324/253 |

FOREIGN PATENT DOCUMENTS

| DE | 3820502 A1 * | 12/1989 |
|---|---|---|
| JP | 2000284030 A | 10/2000 |
| KR | 1020040104869 A | 12/2004 |

OTHER PUBLICATIONS

Fleischer et al., English Translation of Abstract of DE 3820502 A1, Dec. 1989.*

* cited by examiner

*Primary Examiner*—Bot L LeDynh
(74) *Attorney, Agent, or Firm*—Sughrue Mion, PLLC

(57) ABSTRACT

A fluxgate sensor includes a magnetic core including CoNbZr, an excitation coil, and a magnetic field sensing coil. The fluxgate sensor can use CoNbZr. A low coercivity and high magnetic permeability can be obtained.

8 Claims, 5 Drawing Sheets

FLUXGATE SENSOR HAVING CONBZR MAGNETIC CORE AND FABRICATION METHOD THEREOF

CROSS-REFERENCE TO RELATED APPLICATIONS

This application claims priority from Korean Patent Application No. 10-2005-98597 filed on Oct. 19, 2005 in the Korean Intellectual Property Office, the entire disclosure of which is incorporated herein by reference.

BACKGROUND OF THE INVENTION

1. Field of the Invention

The present invention generally relates to a fluxgate sensor and a fabrication method thereof. More particularly, the present invention relates to a fluxgate sensor using a CoNbZr magnetic core, and a fabrication method thereof.

2. Description of the Related Art

A fluxgate sensor can detect magnetic energy that is insensible directly by human sensory organs. Such a magnetism sensor has a broad application in various fields such as airplanes, location awareness systems for ship and vehicle, motion detection in virtual space, terrestrial magnetism compensation and bleeding color correction of HDTV, and magnetoencephalography and magnetocardiography using medical instruments.

A micro fluxgate sensor is mainly composed of a magnetic core which is wound with two coils. One coil, an excitation coil, is used to produce a magnetic field which saturates the magnetic core. The other coil, a detection coil or a magnetic field sensing coil, is used to detect changes in the magnetic flux in the core. A basic sensing principle of a fluxgate sensor lies in a non-linear characteristic, i.e., saturation characteristic of the magnetic core. When a magnetic field is generated by supplying sufficient alternating current to the excitation coil, magnetic flux density in the magnetic core is saturated periodically. At this time, when an external magnetic field, which is to be measured, is applied, the magnetic flux density in the magnetic core changes and the magnetic field sensing coil measures intensity of the external magnetic field by measuring the change of the magnetic flux density in the core.

Coercivity is the intensity of the applied magnetic field required to reduce the magnetization of a magentic material to zero after the magnetization of the material has been driven to saturation. For a fluxgate sensor, it is advantageous to have a low cocercivity. Permalloy has been used as a material of a core of fluxgate sensors because it has a high magnetic permeability and low coercivity. The permalloy refers to a nickel iron magnetic alloy such as Fe—Ni alloy, Fe—Ni—Mo alloy, and the like.

SUMMARY OF THE INVENTION

The present invention is to provide a fluxgate sensor having low coercivity. An aspect of the present invention is to provide a fluxgate sensor having low coercivity by use of a magnetic core made of CoNbZr, and a fabrication method thereof.

In accordance with one aspect of the present invention, a fluxgate sensor includes a magnetic core including CoNbZr; a first coil for producing a magnetic field which saturates the magnetic core; and a second coil for detecting a change in a magnetic flux in the core. The first coil may be an excitation coil and the second coil may be a magnetic field sensing coil.

The CoNbZr may be a mixture of cobalt (Co), niobium (Nb) and zirconium (Zr) in a ratio of about 87±a: about 5±b: about 8±c (atomic percentage), where a, b and c of the ratio respectively is a constant of 0, 1, 2 or 3.

The fluxgate sensors including a magnetic core comprising CoNbZr may be fabricated into various geometries including planar or tube (bar) shapes. In the case of a planar fluxgate, the magnetic core may be in the form of a layer and a CoNbZr layer may have a thickness ranging from about 0.1 µm to about 10 µm.

The magnetic core may be a multilayer where the CoNbZr and an insulating layer are alternatively disposed.

The magnetic core may be a multilayer where the CoNbZr and a magnetic layer are alternately disposed.

The CoNbZr layer may be formed by a deposition using a DC sputtering.

The magnetic core of the fluxgate sensor may have a geometry which allows a production of a closed magnetic flux path. For example, the magnetic core may- have, but is not limited to, a rectangular, square, toroidal or oval geometry and one skilled in the art can design and construct the excitation coil and the magnetic field sensing coil to generate a closed magnetic flux path in the magnetic core and detect changes in the magnetic flux. For example, when the magnetic core has a rectangular geometry, the excitation coil includes a first part winding one of four sides of the rectangular ring; and a second part winding an opposite side of the side wound by the first part. The magnetic field sensing coil winds around two sides wound by the first and second excitation coil parts respectively.

In accordance with another aspect of the present invention, a fabrication method of a fluxgate sensor which includes a magnetic core, an excitation coil winding the magnetic core, and a magnetic field sensing coil winding the magnetic core and the excitation coil, includes (a) depositing a lower coil structure on a certain area of a substrate; (b) depositing a first insulting layer on the lower coil structure and the substrate; (c) fabricating the magnetic core by depositing CoNbZr on a certain area of the first insulating layer; (d) depositing a second insulting layer on the magnetic core and the first insulting layer; and (e) fabricating the excitation coil and the magnetic field sensing coil by depositing an upper coil structure on a certain area of the second insulating layer and connecting the upper coil structure with the lower coil structure.

The CoNbZr may be a mixture of cobalt (Co), niobium (Nb) and zirconium (Zr) in a ratio of about 87±a:5±b:8±c, where a, b and c of the ratio respectively is a constant of 0, 1, 2 and 3.

The CoNbZr may be deposited in a thickness of about 0.1 µm to about 10 µm.

The operation (c) may fabricate the magnetic core by depositing and patterning the CoNbZr on the first insulating layer using a DC sputtering.

The operation (c) may fabricate the magnetic core as a multilayer by depositing a CoNbZr layer consisting of the CoNbZr, and an insulting material in an alternating manner.

The operation (c) may fabricate the magnetic core as a multilayer by depositing a CoNbZr layer consisting of the CoNbZr, and a magnetic layer of other magnetic material in an alternating manner.

BRIEF DESCRIPTION OF THE DRAWING FIGURES

These and/or other aspects and advantages of the present general inventive concept will become apparent and more readily appreciated from the following description of the embodiments, taken in conjunction with the accompanying drawings of which:

DETAILED DESCRIPTION OF THE EXEMPLARY EMBODIMENTS

Figure 1:
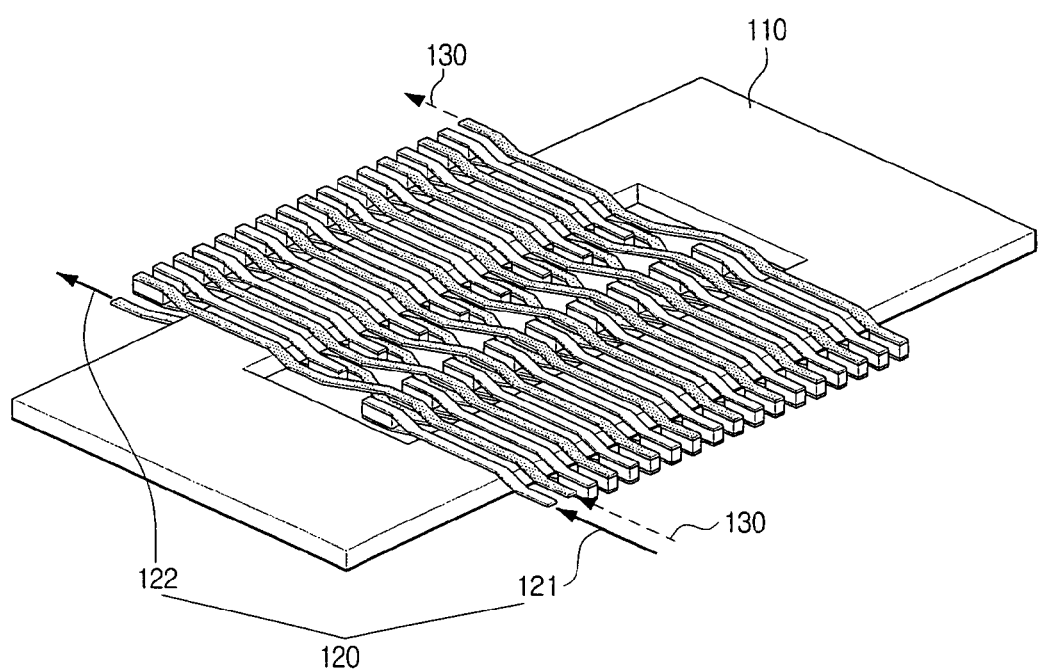
FIG. 1 is a conceptual diagram for illustrating a structure of a fluxgate sensor including a CoNbZr magnetic core according to an embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

FIG. 1 is a conceptual diagram for illustrating a structure of a fluxgate sensor according to an embodiment of the present invention. Referring first to FIG. 1, the fluxgate sensor includes a magnetic core 110, an excitation coil 120, and a magnetic field sensing coil 130.

The magnetic core 110 is fabricated using CoNbZr which is the mixture of cobalt (Co), niobium (Nb) and zirconium (Zr). The mixing ratio of Co—Nb—Zr determines the coercivity property of the fluxgate sensor. The coercivity is the intensity of the magnetic field required to reduce the magnetization of a magnetic material to zero by applying a demagnetizing field to the magnetic material. The coercivity is denoted by Hc[Oe] and varies in value depending on a material.

In the embodiment of the present invention, Co:Nb:Zr can be mixed in the ratio (%) of about 87±a: about 5±b: about 8±c. Herein, a, b and c respectively represent a constant of 0, 1, 2 and 3. Accordingly, for example, when all of a, b and c are zero, Co:Nb:Zr is set to 87:5:8. In addition, the ratio of Co:Nb:Zr may vary in the range of, for example, (85:6:9), (85:5:10), (86:5:9), (86:6:8), (84:7:9), (90:3:7), (90:4:6), (87:6:7) and (87:4:9).

Geometries of the fluxgate sensors including a magnetic core comprising CoNbZr according to the present invention are not limited to specific shapes. For example, the fluxgate sensors may be fabricated into various geometries including thin film or tube (bar) shapes. Methods for fabricating fluxgate sensors of different geometries are known. For example, U.S. 2005/0172480 describes a method of fabricating a fluxgate sensor integrated into a PCB (printed circuit board). The entire disclosure of U.S. 2005/0172480 is incorporated herein by reference.

In one embodiment of the present invention, the magnetic core 110 can be manufactured in the shape of a rectangular ring. In this case, the magnetic core 110 has four sides. The excitation coil 120 winds each of two opposite sides of the four sides. In more detail, the excitation coil 120 includes a first excitation coil part 121 winding one side, and a second excitation coil part 122 winding the opposite side of the side wound by the first excitation coil part 121.

The first and second excitation coil parts 121 and 122 may be connected. For example, one end of the first excitation coil part 121 is connected to one end of the second excitation coil part 122 winding the opposite side. Hence, the excitation coil 120 can be fabricated as a single body of a united structure.

The magnetic field sensing coil 130 may wind around two opposite sides of the core, which are wound by the excitation coil parts 121 and 122. Alternately, the excitation coil 120 and the magnetic field sensing coil 130 may alternatively wind each of two opposite sides of the core. When alternating current is supplied to the excitation coil 120 to generate a magnetic field, a current corresponding to the change of the magnetic flux density in the magnetic core 110 is detected and output by the magnetic field sensing coil 130.

The magnetic core 110 may be fabricated in the shape of two bars. In this case, the excitation coil 120 winds the individual bars respectively, and the magnetic field sensing coil 130 winds around the two bars. The operation principle is the same as in the rectangular ring shape core.

Figure 2:
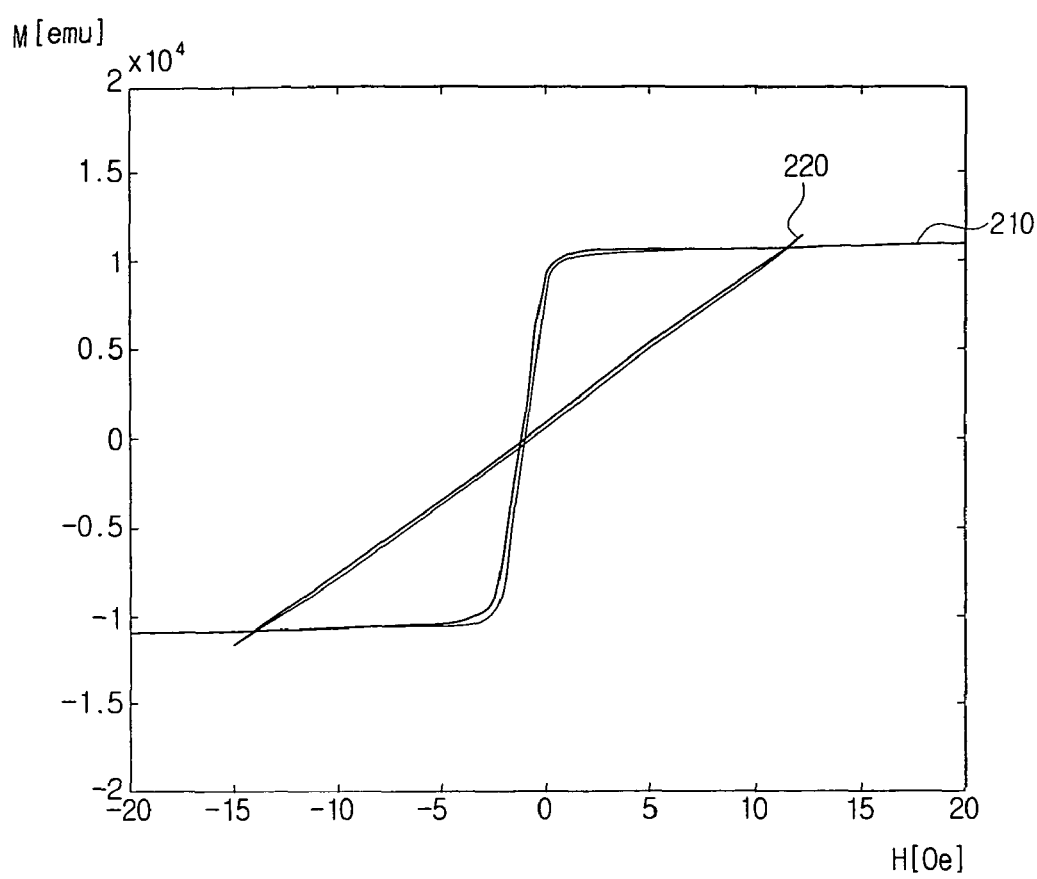
FIG. 2 is a graph for illustrating characteristics of the fluxgate sensor of FIG. 1.

FIG. 2 is a graph for illustrating characteristics of the fluxgate sensor of FIG. 1. Particularly, FIG. 2 shows experimental results of the characteristics of the fluxgate sensor by use of a vibrating sample magnetometer (VSM) system. The VSM system detects the induced electromotive force from a sample by applying a magnetic field and vibrating the sample simultaneously by using two magnetic poles, and measures a magnetization value of the sample from the induced electromotive force.

In FIG. 2, the horizontal axis indicates the intensity H[Oe] of the applied magnetic field and the vertical axis indicates the magnetization value M[emu] measured by the VSM system. A first graph 210 represents the magnetization value measured when the magnetic core 110 is arranged in a direction parallel to the direction of poles in the VSM system. As one can see, both ends section of the first graph 210 are drawn as a single line, whereas the mid section is drawn as two lines. The coercivity (Hc easy) is a value obtained by dividing the width of the two lines by 2. It is noted that the width of the two lines on the first graph 210 is very small.

In FIG. 2, a second graph 220 represents the magnetization value measured when the magnetic core 110 is arranged in a vertical direction to the poles of the VSB system. Like the first graph 210, the mid section of the second graph 220 is drawn as two lines, and a value obtained by dividing the width of the two lines by 2 is the coercivity (Hc hard). The slope of the first and second graphs 210 and 220 is the magnetic permeability. The first graph 210 indicates that the fluxgate sensor of the present invention has a high magnetic permeability.

The magnetic core 110 adapted to the fluxgate sensor comprises CoNbZr. CoNbZr may be formed into a layer on a substrate by various methods, for example a deposition. Deposition may be carried out by, for example, sputtering such as RF sputtering and DC sputtering. DC sputtering, which uses a direct current, may be preferably employed because it produces lower coercivity characteristics. DC. sputtering also provides consistent deposition speeds regardless of the types of metals to be deposited. The sputtering is a deposition technique based on the principle that, when a vacuum chamber is filled with an inert gas such as helium and argon and discharged by applying high voltage to a target (deposition material), the ionized inert gas collides with the target and ions of the target is ejected and deposited on the surface of a substrate.

Table 1 shows the coercivity characteristics (Hc easy and Hc hard) of the fluxgate sensor when CoNbZr is deposited using the DC sputtering.

TABLE 1

| Material (formation method) | Hc easy (axis) | Hc hard (axis) |
|---|---|---|
| CoNbZr (DC sputtering) | 0.03 | 0.03 |
| CoNbZr (RF sputtering) | 1~10 | 1~10 |
| Permalloy (plating) | 0.8 | 1.69 |

Table 1 shows the coercivity values measured under the conditions of 300 W DC current and 3 mtorr argon gas pressure with respect to the fluxgate sensor having a CoNbZr (87:5:8) core of 1 μm thickness in Table 1, as for the fluxgate sensor using CoNbZr fabricated using the DC sputtering, Hc easy and Hc hard values measured were as low as 0.03. By contrast, as for the fluxgate sensor using permalloy deposited using plating method, Hc easy and Hc hard values measured were 0.8 and 1.69, respectively. The coercivity characteristics (Hc easy and Hc hard) of CoNbZr magnetic core, which is deposited by RF sputtering, may be values within a range of 1-10.

Figure 3A:
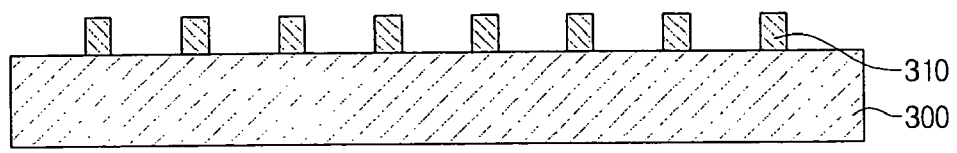
FIGS. 3A through 3F are vertical sectional views for illustrating a fluxgate sensor fabrication method according to an embodiment of the present invention.

The fluxgate sensors having a magnetic core of CoNbZr may be fabricated into various geometries employing methods known in the art. FIGS. 3A through 3F are vertical sectional views for illustrating an exemplary fabrication method of the fluxgate sensor integrated into a PCB. Referring to FIG. 3A, a lower coil structure 310 is deposited on a pre-patterned area of a substrate 300. In further detail, after cleaning the substrate 300, seed (not shown) is deposited. Next, after a photoresist layer pattern (not shown) is generated on the seed, the lower coil structure 310 is fabricated by electroplating a metallic material. Next, the photoresist layer pattern is eliminated.

Figure 3B:
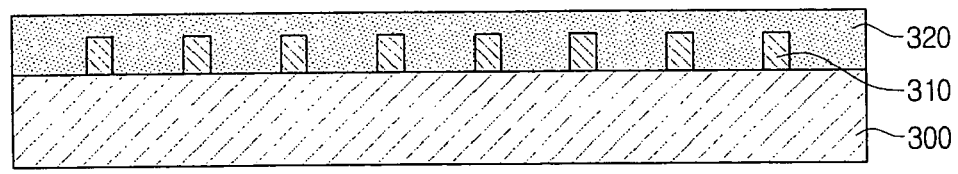

As shown in FIG. 3B, a first insulating layer 320 is deposited all over the substrate 300 where the lower coil structure 310 is fabricated. The insulating layer may be formed of materials known in the art, for example, epoxy resins.

Figure 3C:
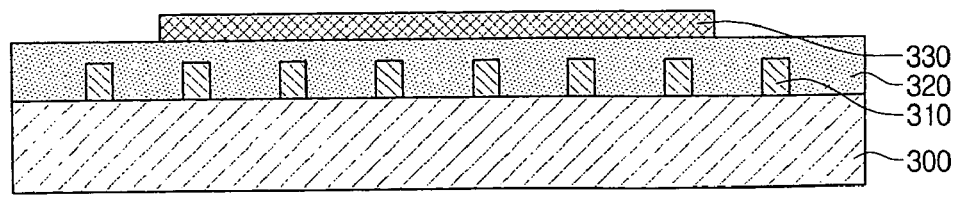

FIG. 3C shows that a magnetic core 330 is fabricated. The magnetic core 330 may be fabricated using different methods known in the art. In an embodiment, the fabrication of the magnetic core 330 is achieved by depositing CoNbZr using DC sputtering.

Figure 3D:
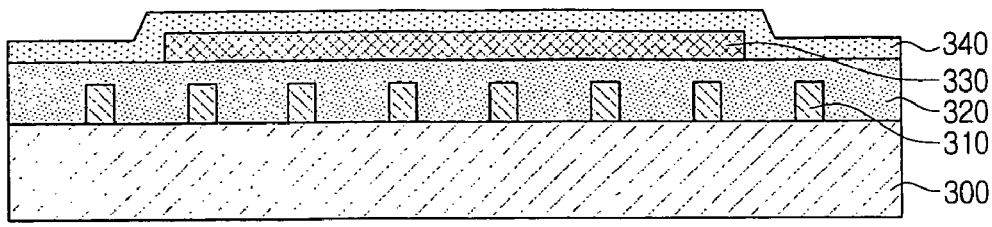

Referring to FIG. 3D, a second insulating layer 340 is deposited on the magnetic core 330 and the first insulting layer 320.

Figure 3E:
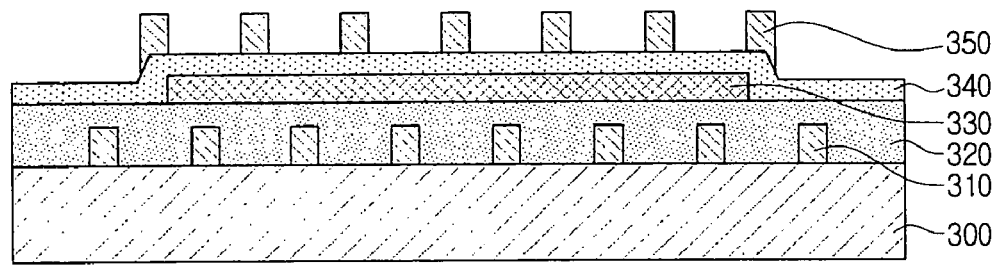

Next, an upper coil structure 350 is fabricated on the second insulating layer 340 as shown in FIG. 3E. The upper coil structure 350 can be fabricated using the same method as the one employed to fabricate the lower coil structure 310. Prior to the fabrication of the upper coil structure 350, a plurality of via holes is formed in the second insulating layer 340 in such a way that the lower coil structure 310 is connected with the upper coil structure 350 to wind around the magnetic core 330. When the lower coil structure 310 and the upper coil structure 350 are interconnected, an excitation coil and a magnetic field sensing coil are formed.

Figure 3F:
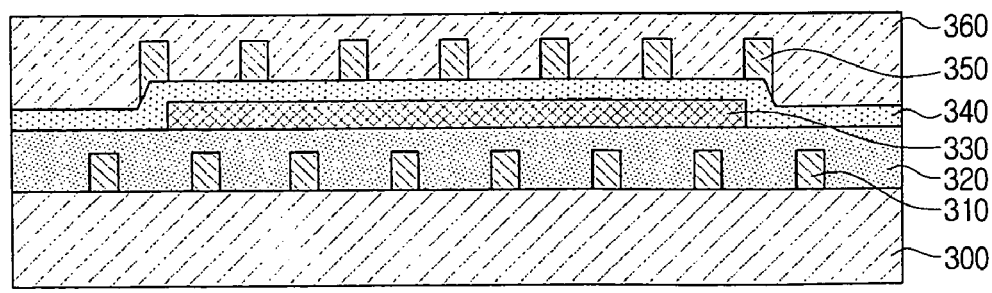

Next, as shown in FIG. 3F, a third insulting layer 360 is deposited on the upper coil structure 350 and the second insulating layer 340. The third insulating layer 360 may serve as a passivation layer.

Figure 4:
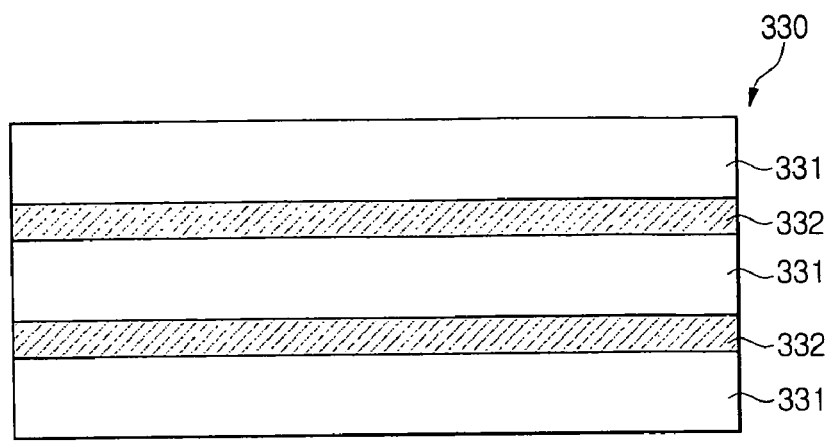
FIGS. 4 and 5 are conceptual diagrams for illustrating an exemplary core structure applicable to the fluxgate sensor of FIG. 1.
Figure 5:
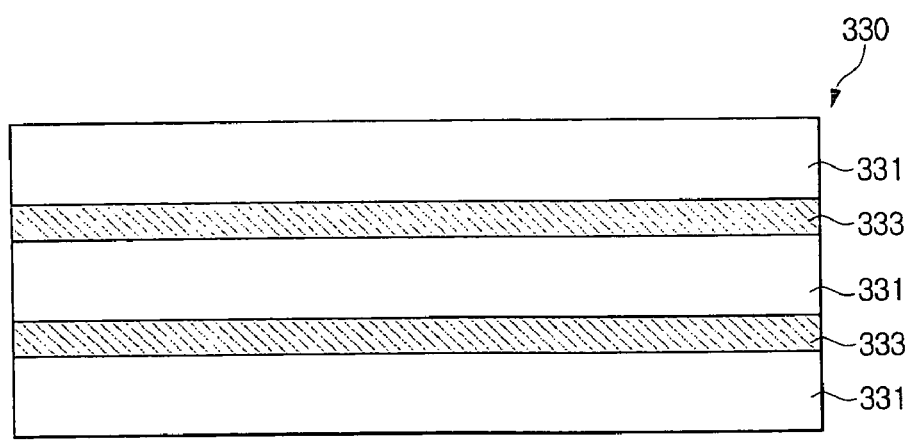

The magnetic core 330 may be fabricated as a multilayer. FIGS. 4 and 5 are vertical sectional views of the multilayer magnetic core 330.

The multilayer magnetic core may be formed of one or more CoNbZr layers and one or more insulating layers. For example, referring now to FIG. 4, the multilayer may be constructed by depositing CoNbZr 331 and an insulating layer 332 in an alternating manner. The insulating layer 332 may have a same pattern as CoNbZr layer 331. For example, CoNbZr 331 is deposited on the first insulating layer 320 (as shown in FIGS. 3B-3F), and the insulating layer 332, CoNbZr 331, the insulating layer 332, and CoNbZr layer 331 are deposited sequentially. The insulating layer 332 of the magnetic core may be formed of, for example, $SiO_2$, $SiO_3N_4$ and the like.

The multilayer magnetic core may be formed of one or more CoNbZr layers and one or more magnetic layers. For example, referring to FIG. 5, the multilayer may be constructed by depositing CoNbZr layer 331 and a magnetic layer 333 in the alternating manner. CoNbZr layer 331 is deposited on the first insulating layer 320 (as shown in FIGS. 3B-3F), and the magnetic layer 333 having the same pattern as CoNbZr layer 331 is deposited. Next, CoNbZr layer 331, the magnetic layer 333, and CoNbZr layer 331 are deposited sequentially. The magnetic layer 333 may be formed of permalloy such as NiFe and FeTaN. Alternatively, the magnetic layer 333 may be a CoNbZr layer having a different composition from CoNbZr layer 331.

When the magnetic core is the multilayer as shown in FIGS. 4 and 5, the magnetic flux transmission amount of the magnetic core increases and the leakage flux from the magnetic core decreases. Thus, the performances of the fluxgate sensor are further enhanced.

As set forth above, the fluxgate sensor of the present invention employs a magnetic core formed from CoNbZr. A lower coercivity, an increased magnetic flux transmission, and a decreased flux leakage can be obtained.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A fluxgate sensor comprising:
a substrate;
a first insulating layer on the substrate;
a magnetic core formed on the first insulating layer;
a second insulating layer formed on the magnetic core;
a first coil which produces a magnetic field which saturates the magnetic core; and
a second coil which detects a change in a magnetic flux in the magnetic core,
wherein the magnetic core is multilayered in which at least one CoNbZr layer and at least one layer are disposed alternately in a direction perpendicular to a surface of the substrate, wherein the at least one layer is an insulating layer or a magnetic layer.

2. The fluxgate sensor as in claim 1, wherein the at least one CoNbZr layer is a mixture of cobalt (Co), niobium (Nb) and zirconium (Zr) in a ratio of about 87±a: about 5±b: about 8±c, where a, b and c of the ratio respectively is a constant of 0, 1, 2 or 3.

3. The fluxgate sensor as in claim 1, wherein the at least one CoNbZr layer has a thickness ranging from about 0.1 μm to about 10 μm.

4. The fluxgate sensor as in claim 1, wherein the at least one CoNbZr layer is deposited using a DC sputtering.

5. The fluxgate sensor as in claim 1, wherein the magnetic core has a geometry which generates a closed magnetic flux path.

6. The fluxgate sensor as in claim 5, wherein the magnetic core has a rectangular or square geometry.

7. The fluxgate sensor as in claim 6, wherein the first coil comprises:
   a first part winding one of four sides of the rectangular or square geometry; and
   a second part winding an opposite side of the side wound by the first part.

8. The fluxgate sensor as in claim 7, wherein the second coil winds around two sides wound by the first and second parts respectively.

* * * * *